United States Patent
Abu Hilal

(10) Patent No.: US 10,067,554 B2
(45) Date of Patent: Sep. 4, 2018

(54) VCONN PULL-DOWN CIRCUITS AND RELATED METHODS FOR USB TYPE-C CONNECTIONS

(71) Applicant: Silicon Laboratories Inc., Austin, TX (US)

(72) Inventor: Obaida Mohammed Khaled Abu Hilal, Singapore (SG)

(73) Assignee: Silicon Laboratories Inc., Austin, TX (US)

( * ) Notice: Subject to any disclaimer, the term of this patent is extended or adjusted under 35 U.S.C. 154(b) by 210 days.

(21) Appl. No.: 15/165,591

(22) Filed: May 26, 2016

(65) Prior Publication Data

US 2017/0344098 A1    Nov. 30, 2017

(51) Int. Cl.
| | |
|---|---|
| G06F 13/40 | (2006.01) |
| G06F 1/32 | (2006.01) |
| H03K 17/22 | (2006.01) |
| H03K 5/08 | (2006.01) |
| G06F 13/42 | (2006.01) |
| H03K 19/0185 | (2006.01) |

(52) U.S. Cl.
CPC ........ *G06F 1/3287* (2013.01); *G06F 13/4022* (2013.01); *G06F 13/4282* (2013.01); *H03K 5/08* (2013.01); *H03K 17/223* (2013.01); *H03K 19/018592* (2013.01)

(58) Field of Classification Search
CPC ..................... G06F 1/3287; H03K 19/018592
See application file for complete search history.

(56) References Cited

U.S. PATENT DOCUMENTS

| | | |
|---|---|---|
| 5,311,391 A | 5/1994 | Dungan et al. |
| 6,522,511 B1 | 2/2003 | John et al. |
| 7,098,717 B2 | 8/2006 | Watt |
| 7,339,770 B2 | 3/2008 | Maloney et al. |
| 7,760,476 B2 | 7/2010 | Riviere et al. |
| 7,787,224 B2 | 8/2010 | Kemper |
| 9,400,546 B1 * | 7/2016 | Agarwal ............... G06F 1/3287 |

(Continued)

OTHER PUBLICATIONS

Notice of Allowance dated Jul. 23, 2017, Obaida Mohammed Khaled Abu Hilal, "Voltage Claim Circuits and Related Methods", U.S. Appl. No. 15/165,408, filed May 26, 2016, 7 pgs.

(Continued)

*Primary Examiner* — Tammara R Peyton
(74) *Attorney, Agent, or Firm* — Egan Peterman Enders Huston

(57) ABSTRACT

VCONN pull-down circuits and related methods are disclosed for USB Type-C connections. A device is connected through a USB Type-C connection to a separate device using connections including a CC (configuration channel) pin and a VCONN (connection power) pin. The device pulls down the VCONN pin to ground through a resistance (Ra) by applying the voltage on the CC pin to close a switch coupled between the VCONN pin and ground. The device can also be operated in a dead-battery mode where no supply voltage is present for the device. The device can also stop the pull-down on the VCONN pin after a connection is established, for example, using additional switches coupled to a pull-down control signal to remove the CC voltage and open the switch. The voltage on the CC pin can also be clamped to a desired voltage or voltage range using a voltage clamp.

24 Claims, 11 Drawing Sheets

(56) References Cited

U.S. PATENT DOCUMENTS

| | | | |
|---|---|---|---|
| 9,625,988 B1* | 4/2017 | Agarwal | G06F 1/3296 |
| 9,800,233 B1 | 10/2017 | Hilal | |
| 9,871,524 B2* | 1/2018 | Kim | H03K 19/018592 |
| 2015/0261714 A1* | 9/2015 | Talmola | G06F 13/4081 |
| | | | 710/313 |
| 2015/0268688 A1* | 9/2015 | Leinonen | G05F 3/02 |
| | | | 307/147 |

OTHER PUBLICATIONS

Microchip, AN1953, Introduction to USB Type C, 20 pg. (Jan. 2015).
Texas Instruments, TUSB320, TUSB320I, TUSB320 USB Type-C Configuration Channel Logic and Port Control, 33 pgs. (Jun. 2015).
Universal Serial Bus Power Delivery Specification, Rev. 2.0, V1.1, 544 pgs. (May 7, 2015).
Universal Serial Bus Type-C Cable and Connector Specification, Rel. 1.1., 180 pgs. (Apr. 3, 2015).
Patent Application, Obaida Mohammed Khaled Abu Hilal, "Voltage Clamp Circuits And Related Methods", U.S. Appl. No. 15/165,408, filed May 26, 2016, 37 pgs.
Office Action dated Feb. 28, 2017, Obaida Mohammed Khaled Abu Hilal, "Voltage Clamp Circuits And Related Methods", U.S. Appl. No. 15/165,408, filed May 26, 2016, 16 pgs.
Response To Office Action filed Jun. 28, 2017, Obaida Mohammed Khaled Abu Hilal, "Voltage Clamp Circuits And Related Methods", U.S. Appl. No. 15/165,408, filed May 26, 2016, 15 pgs.

* cited by examiner

VCONN PULL-DOWN CIRCUITS AND RELATED METHODS FOR USB TYPE-C CONNECTIONS

TECHNICAL FIELD

This technical field relates to USB (Universal Serial Bus) Type-C connections and, more particularly, to VCONN (connection power) pull-down circuits for USB Type-C connections.

BACKGROUND

Various USB (Universal Serial Bus) connectors and related standards have been developed. Recently, a USB Type-C standard has been developed having various requirements for USB Type-C connectors and the operation of devices implementing USB Type-C connections. Once two USB Type-C devices have completed connection negotiations and are connected through a USB Type-C connection, one device will operate as a DFP (downward facing port) device while the other device will operate as a UFP (upward facing port) device. It is also noted that these roles can be swapped based upon additional communications between the two devices. The USB Type-C standard is described, for example, in the USB Type-C Cable and Connector Specification (v1.1) released in 2015.

For the physical connection, the USB Type-C standard provides a variety of potential physical connection types including a Type-C plug and a Type-C receptacle. The Type-C plug is symmetrical and can be inserted into the Type-C receptacle in two orientations. As such, the USB Type-C standard includes an orientation detection procedure so that a device having a Type-C receptacle can determine the orientation for an inserted Type-C plug from another device. While there are a variety of connections in the USB Type-C connection, two of these connections are the VCONN (connection power) connection and the CC (configuration channel) connection. The CC connection is used for cable orientation detection as well as configuration and management of connections across a USB Type-C cable. The VCONN connection is used to power active or electronically marked cables. In some applications, such as with VCONN powered accessories, the power from the VCONN connection provides the only power source. In other applications, such as with cell phones, the power from the VCONN connection is used to run low-power features.

In part, the USB Type-C specification requires a UFP device in dead-battery or unattached modes to pull down a small resistance (Ra) on the VCONN connection to ground. Dead-battery mode is a condition where no supply is present or being applied to the UFP device so that the UFP device is an unpowered device. As set forth in the USB Type-C specification, attached mode includes states after two USB Type-C devices have established a connection, and unattached mode includes states when a USB Type-C device is waiting to be detected to establish a connection to another USB Type-C device. The resistance (Ra) can be detected by a DFP device, for example, by injecting a small current (Ip) directly to the VCONN connection between the devices or by pulling a small resistance (Rp) to a supply voltage (Vp) on the VCONN connection between the devices. A similar small current (Ip) or small resistance (Rp) pulled to a supply voltage (Vp) is also provided by the DFP device on the CC connection. The DFP device then monitors voltages on both the VCONN connection and the CC connection to determine device orientation and operational modes. For example, when the DFP device detects the presence of the VCONN resistance (Ra), the DFP device can then provide VCONN power to the UFP device through the VCONN connection. As the voltage on the VCONN connection is relatively small before the DFP device applies power to the VCONN connection and as there is no other voltage source in dead-battery modes, the USB Type-C specification becomes difficult to achieve with CMOS transistors.

SUMMARY

VCONN pull-down circuits and related methods are disclosed for USB (Universal Serial Bus) Type-C connections. For the embodiments described herein, a device is connected through a USB Type-C connection to a separate device using a plurality of connections including a CC (configuration channel) pin and a VCONN (connection power) pin. The device pulls down the VCONN pin to ground through a resistance (Ra) by applying the voltage on the CC pin to close a switch coupled between the VCONN pin and ground. The device can also be operated in a dead-battery mode where no supply voltage is present for the device. The device can also stop the pull-down on the VCONN pin after a connection is established, for example, using additional switches coupled to a pull-down control signal to remote the CC voltage from the control node and open the switch. In addition, the voltage on the CC pin can be clamped to a desired voltage or voltage range using a voltage clamp. Other features and variations can be implemented, if desired, and related systems and methods can be utilized, as well.

For one embodiment, a method for VCONN connection pull-down in a USB Type-C device is disclosed including connecting a device through a USB Type-C connection to a separate device using a plurality of connections including a CC (configuration channel) pin and a VCONN (connection power) pin and pulling the VCONN pin to ground through a resistance (Ra) by applying a voltage on the CC pin to close a VCONN pull-down switch coupled between the CC pin and ground.

In additional embodiments, the method includes providing the voltage on the CC pin to a control node of the VCONN pull-down switch through a second switch. In further embodiments, the method includes controlling the second switch with a pull-down control signal to be closed when the device is operating in an unattached mode or a dead-battery mode and to be open when the device is operating in an attached mode or a powered mode. In still further embodiments, the pull-down control signal can include at least one of a power supply voltage, a power-on-reset (POR) signal, a voltage on the VCONN pin, or a logic control signal. In addition, the method includes providing the voltage on the CC pin to the control node of the VCONN pull-down switch through a direct connection.

In additional embodiments, the VCONN pull-down switch includes an NMOS transistor having its source and drain coupled between the VCONN pin and ground and having its gate coupled as the control node for the VCONN pull-down switch. In further embodiments, the NMOS transistor is configured to provide the resistance (Ra) when turned on to pull the VCONN pin to ground. In still further embodiments, the second switch is a PMOS transistor having its gate coupled to the pull-down control signal and having its source and drain coupled between the CC pin and the control node for the VCONN pull-down switch. In further embodiments, the method can also include coupling the gate of the NMOS transistor to ground through a third switch when the device is operating in the attached mode or the powered mode.

In additional embodiments, the method includes clamping the voltage on the CC pin using a voltage clamp coupled to the CC pin and applying the clamped voltage on the CC pin to a control node for the VCONN pull-down switch. In further embodiments, the voltage clamp includes at least one of a diode clamp circuit or a closed loop voltage clamp. In still further embodiments, the method includes activating the voltage clamp when the device is operating in an unattached mode or a dead-battery mode and deactivating the voltage clamp when the device is operating in an attached mode or a powered mode.

For another embodiment, a circuit for connection pull-down in a USB Type-C device is disclosed including a CC (cable connection) pin for a USB Type-C connection, a VCONN (connection power) pin for a USB Type-C connection, a VCONN pull-down switch coupled to ground and to the VCONN pin, and a control circuit coupled to the CC pin and to the VCONN pull-down switch where the control circuit is configured to apply a voltage on the CC pin to close the VCONN pull-down switch in order to pull the VCONN pin to ground through a resistance (Ra).

In additional embodiments, a second switch is coupled between the CC pin and a control node for the VCONN pull-down switch. In further embodiments, the second switch has a control node coupled to a pull-down control signal, and the pull-down control signal is configured to close the second switch when the device is operating in an unattached mode or a dead-battery mode and to open the second switch when the device is operating in an attached mode or a powered mode. In still further embodiments, the pull-down control signal can be at least one of a power supply voltage, a power-on-reset (POR) signal, a voltage on the VCONN pin, or a logic control signal. In other embodiments, the CC pin can be directly connected to the control node of the VCONN pull-down switch.

In additional embodiments, the VCONN pull-down switch includes an NMOS transistor having its source and drain coupled between the VCONN pin and ground and having its gate coupled as the control node for the VCONN pull-down switch. In further embodiments, the NMOS transistor is configured to provide the resistance (Ra). In still further embodiments, the second switch is a PMOS transistor having its gate coupled to the pull-down control signal and having its source and drain coupled between the CC pin and the control node for the VCONN pull-down switch. In further embodiments, the circuit includes a third switch coupled between the control node for the VCONN pull-down switch and ground where the third switch is configured to couple the gate of the NMOS transistor to ground when the device is operating in the attached mode or the powered mode.

In additional embodiments, the circuit includes a voltage clamp coupled to the CC pin. In further embodiments, the voltage clamp includes at least one of a diode clamp circuit or a closed loop voltage clamp. In still further embodiments, the voltage clamp is coupled to receive a disable signal where the disable signal is configured to enable the voltage clamp when the device is operating in an unattached mode or a dead-battery mode and to disable the voltage clamp when the device is operating in an attached mode or a powered mode.

Different or additional features, variations, and embodiments can be implemented, if desired, and related systems and methods can be utilized, as well.

DESCRIPTION OF THE DRAWINGS

It is noted that the appended drawings illustrate only example embodiments and are, therefore, not to be considered limiting of their scope, for the illustrated embodiments may admit to other equally effective embodiments.

DETAILED DESCRIPTION

Figure 1:
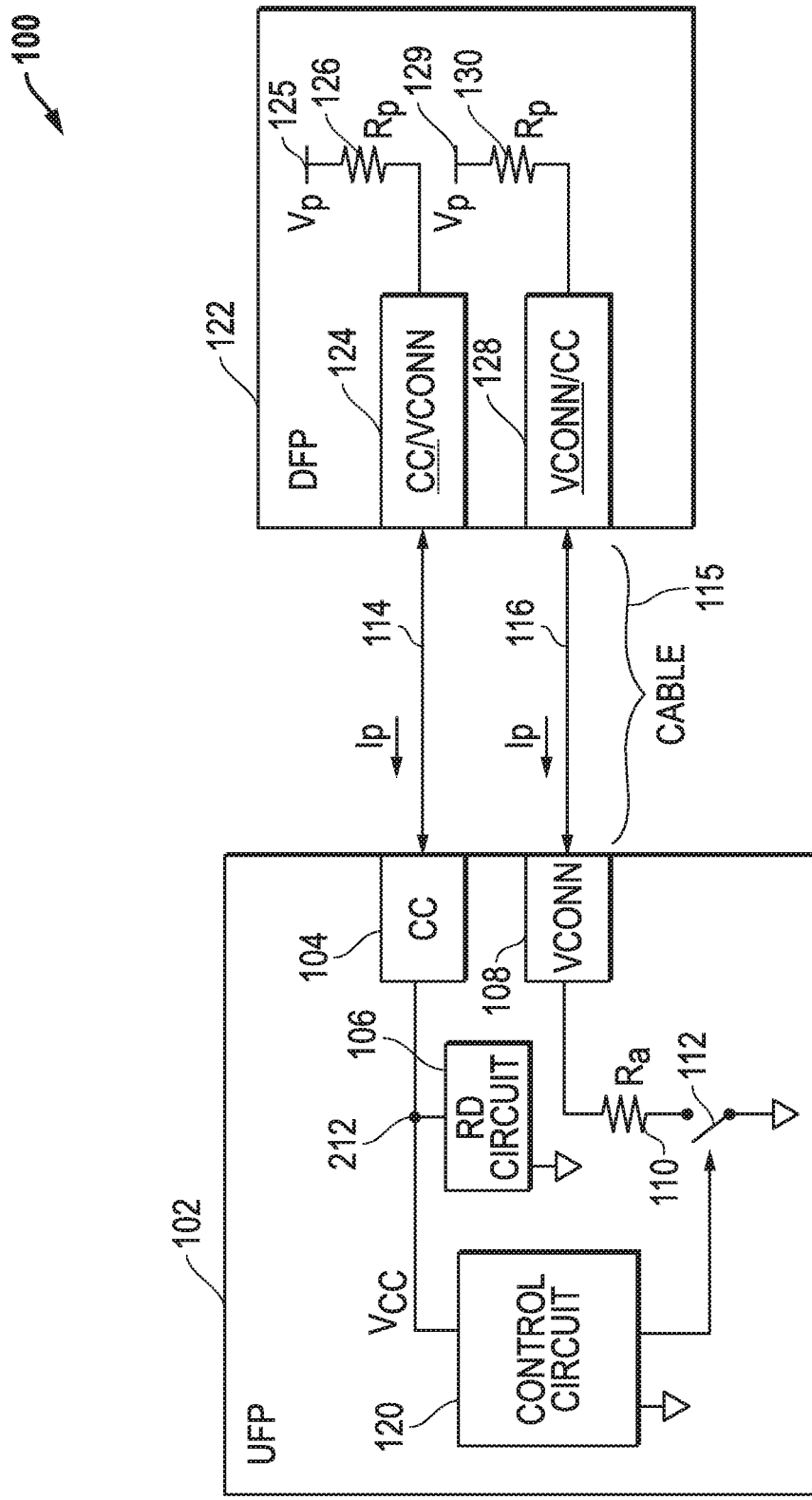
FIG. 1 is a diagram of an example embodiment for a device operating as a UFP device for a USB Type-C connection and a device operating as a DFP device in a USB Type-C connection.

VCONN pull-down circuits and related methods are disclosed for USB (Universal Serial Bus) Type-C connections. For the embodiments described herein, a device is connected through a USB Type-C connection to a separate device using a plurality of connections including a CC (configuration channel) pin and a VCONN (connection power) pin. The device pulls down the VCONN pin to ground through a resistance (Ra) by applying the voltage on the CC pin to close a switch coupled between the VCONN pin and ground. The device can also be operated in a dead-battery mode where no supply voltage is present for the device. The device can also stop the pull-down on the VCONN pin after a connection is established, for example, using additional switches coupled to a pull-down control signal to remove the CC voltage from the control node and open the switch. In addition, the voltage on the CC pin can be clamped to a desired voltage or voltage range using a voltage clamp. Different features and variations can be implemented, as desired, and related systems and methods can be utilized, as well.

Embodiments described herein provide VCONN pull-down in unattached and dead battery modes for devices having USB Type-C connections. As indicated above, orientation detection for a USB Type-C connection between two USB Type-C devices involves the VCONN connection and the CC connection between the two devices in certain modes. For example, when the UFP (upward facing port) device is in unattached or dead-battery modes according to the USB Type-C specification, the UFP device is to present a pull-down resistance (Ra) on the VCONN connection when an injection current (Ip) is presented on the DFP CC/VCONN connections. The disclosed embodiments achieve this unattached or dead battery pull-down for a VCONN pin using a switch controlled by a voltage on the CC pin. This switch is thereby used to present the resistance (Ra) for the VCONN connection that is required by the USB Type-C specification. When a supply voltage is present and the device is no longer in dead-battery mode, this VCONN switch can be opened to disconnect the path to ground. As such, the disclosed embodiments advantageously allow for CMOS transistors available in typical CMOS processes to be used for the VCONN pull-down switch despite small voltages that are available during dead-battery mode. The disclosed embodiments thereby avoid the need for special process transistors (e.g., native PMOS or JFET) and avoid the need for off-chip transistors (e.g., JFET) or resistors.

Further, for certain embodiments described herein, the CC pin is clamped to a voltage using a voltage clamp at the CC pin to clamp to the voltage (vRd) required by the USB Type-C specification. This voltage clamp can be implemented, for example, using a diode clamp circuit, using a closed loop clamp circuit, and/or using other desired voltage clamp circuitry. For certain conditions, as described herein, the clamped voltage on the CC pin is used to control the VCONN switch that connects or disconnects the VCONN connection to ground, for example, during the unattached or dead-battery modes. In addition, the voltage clamps described herein with respect to FIGS. 7-11 can be used more generally in a variety of environments and implementations where a well-controlled clamped voltage is desired.

FIG. 1 is a diagram of an example embodiment 100 for a device 102 operating as a UFP (upward facing port) device for a USB Type-C connection and a device 122 operating as a DFP (downward facing port) device in a USB Type-C connection. For the purposes of embodiment 100, it is assumed that these UFP/DFP roles are the default roles for the two USB Type-C devices 102/122 before any role swapping occurs. Further for this embodiment, the UFP device 102 includes a CC pin 104 and a VCONN pin 108 along with other connections for the USB Type-C connection through a cable 115. The DFP device 122 includes pins 124 and 128 that can each be purposed as a CC pin or as a VCONN pin along with other connections for the USB Type-C connection through cable 115. For the embodiment depicted, it is assumed that the DFP device is using pin 124 for the CC connection to CC pin 104 and is using pin 128 as the VCONN connection to VCONN pin 108 through cable 115.

In operation, the DFP device 122 presents a current (Ip) 114/116 to both the CC connection 104 and the VCONN connection 108 for the UFP device 102 through the USB Type-C cable connection 115. For embodiment 100, it is assumed that the DFP device 122 presents the currents (Ip) 114/116 by pulling resistances (Rp) 126/130 on both of the CC/VCONN pins 124/128 to a supply voltage (Vp) 125/129, although the currents (Ip) 114/116 could also be supplied directly through a current source or current mirror as set forth in the USB Type-C specification. It is noted that the supply voltage (Vp) 125/129 can also be provided by the VCONN pin or other pins (e.g., VBUS) for the USB Type-C connection. When the UFP device 102 is in unattached or dead-battery mode and after a current (Ip) 116 has been presented on the VCONN connection 128 by the DFP device 122, the VCONN pin 108 is pulled to ground through a switch 112 to present a resistance (Ra) 110 on the VCONN pin 108. For the embodiments described herein, the switch 112 is controlled by the voltage (VCC) on the CC pin 104 coupled through node 212 and control circuit 120 to the switch 112. As shown in the example embodiment 100, the CC pin 104 is coupled to node 212, and the control circuit 120 provides an output that is coupled to control switch 112. Control circuitry 120 is also coupled between node 212 and ground. The RD circuit 106 is coupled between node 212 and ground and operates to present a clamped voltage (vRd) or a pull-down resistance (Rd) on the CC pin 104 as required by the USB Type-C specification. As described in more detail below with respect to FIGS. 3A-B and FIGS. 7-11, the RD circuit 106 can be implemented using voltage clamp circuitry.

It is noted that the resistance (Ra) 110 can be implemented using one or more resistors and/or other circuits that provide an impedance between the VCONN connection 108 and ground. For example, a MOS (metal oxide semiconductor) transistor turned "on" or connected as a resistor can be used to provide the resistance (Ra) 110. It is also noted that the switch 112 can be implemented using a MOS transistor, such as an NMOS transistor, and/or other circuits that operate as a switch based upon a voltage (VCC) on the CC pin 104 that is applied by control circuit 120 to the switch 112. It is further noted that embodiment 100 provides one example orientation for UFP and DFP devices for USB Type-C connections, and other orientations could be used while still taking advantage of the VCONN pull-down switch control techniques described herein.

Figure 2A:
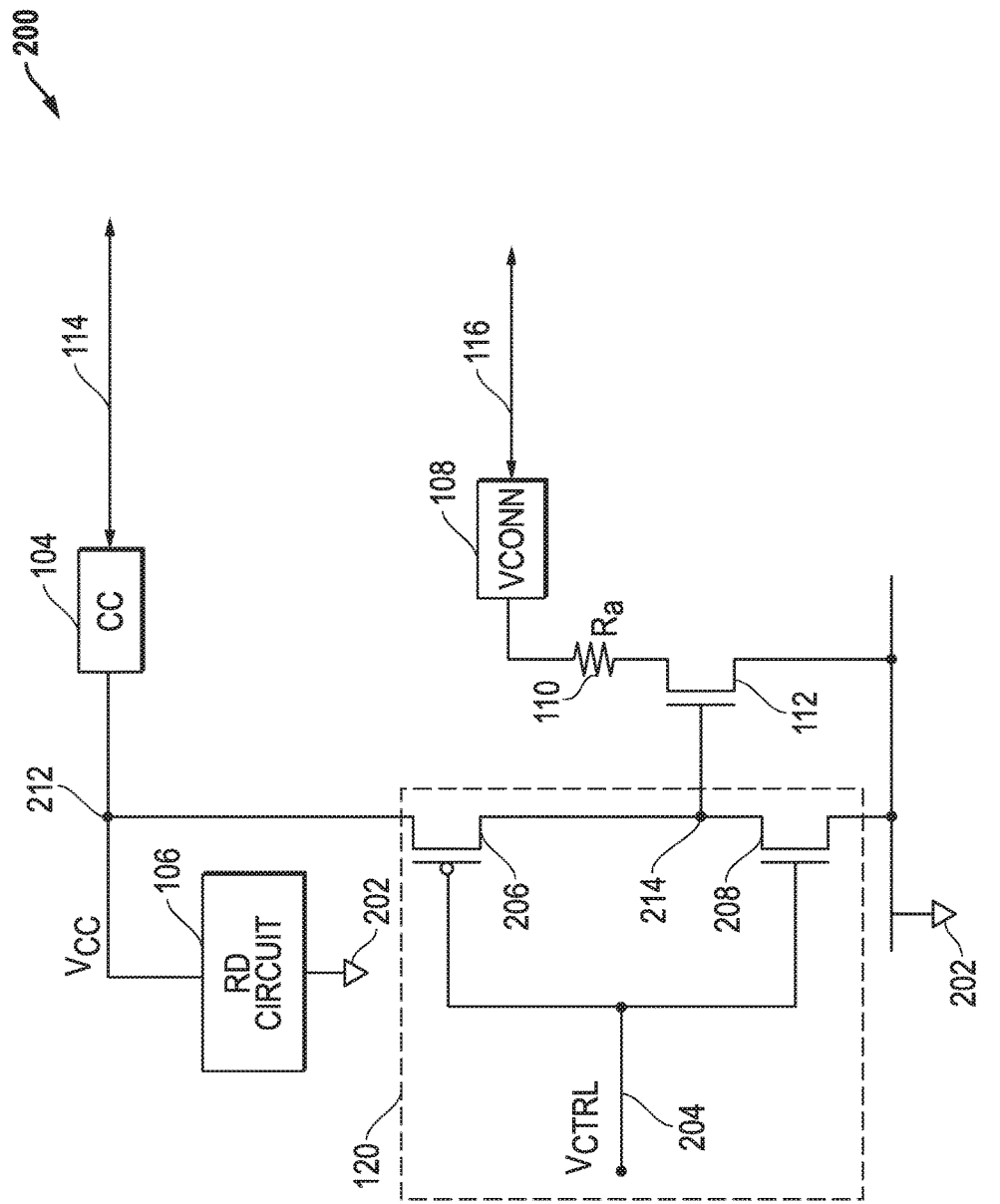
FIGS. 2A-C are circuit diagrams of example embodiments for the control circuit and the pull-down circuits in the UFP device of FIG. 1 along with the CC pin and the VCONN pin.

FIG. 2A is a circuit diagram of an example embodiment 200 for the control circuit 120 and the switch 112 along with the CC pin 104 and the VCONN in 108. For example embodiment 200 the control circuit 120 includes PMOS (p-type metal oxide semiconductor) transistor 206 and NMOS (n-type metal oxide semiconductor) transistor 208. The CC pin 104 is coupled to node 212, and the RD circuit 106 is coupled between node 212 and ground 202. PMOS transistor 206 has its source and drain coupled between node 212 and node 214 and has its gate connected to a pull-down control signal (Vctrl) 204 for the UFP device 102. NMOS transistor 208 has its drain and source coupled between node 214 and ground 202 and has its gate node coupled to pull-down control signal (Vctrl) 204. For example embodiment 200, switch 112 is implemented as an NMOS transistor 112. NMOS transistor 112 has its drain and source coupled between resistance (Ra) 110 and ground 202 and has its gate coupled to node 214. Resistance (Ra) 110 is coupled between the VCONN connection 108 and the NMOS transistor 112. As shown in more detail in FIG. 5, it is noted that the resistance (Ra) 110 can be prodded by the "on" resistance of the transistor 112.

In operation, the DFP device 122 presents currents (Ip) 114/116 to both the CC pin 104 and the VCONN pin 108. For unattached or dead-battery modes where a pull-down of the VCONN pin 108 is desired, the voltage for the pull-down control signal ($V_{CTRL}$) 204 is set to a low voltage. As such, NMOS transistor 208 will be off (e.g., open switch), and PMOS transistor 206 will be on (e.g., closed switch). The voltage (VCC) on node 212 will be a positive voltage and is provided through PMOS transistor 206 to node 214 and thereby to the gate of NMOS transistor 112. NMOS transistor 112, therefore, will be on (e.g., closed switch) and will pull the VCONN pin 108 to ground 202. As such, the resistance (Ra) 110 is presented on the VCONN pin 108 thereby satisfying the requirements of the USB Type-C specification for unattached and dead-battery modes.

When the UFP device 102 goes into attached mode or when a supply voltage is applied to the UFP device 102 such that the UFP device 102 is no longer in dead-battery or detached modes and is operating in a powered attached mode such that pull-down of the VCONN pin is no longer desired, the voltage for the pull-down control signal ($V_{CTRL}$) 204 can be set to a high voltage. As such, PMOS transistor 206 will be off (e.g., open switch), and NMOS transistor 208 will be on (e.g., closed switch) and will pull node 214 to ground 202. NMOS transistor 112, therefore, will be off (e.g., open switch) thereby disconnecting the VCONN pin 108 from ground 202 and thereby satisfying the requirements of the USB Type-C specification.

Where VCONN pull down is only needed for dead battery mode, it is noted that the pull-down control signal ($V_{CTRL}$) 204 for a UFP device 102 can be implemented as a connection to a power supply voltage for the UFP device 102, a voltage on the VCONN pin 108, a power-on-reset (POR) signal generated by the device, or another voltage supply signal. For dead battery or unattached modes, the pull-down control signal ($V_{CTRL}$) 204 can also be implemented as a logic control signal generated by an on-chip control circuit or processor, and/or another signal that is one logic voltage level (e.g., low logic level) when a VCONN pin pull-down is desired for the UFP device 102 and is another logic voltage level (e.g., high logic level) when a VCONN pull-down is not desired for the UFP device 102 for unattached and dead battery modes. It is also noted that PMOS transistor 206 is not required to pass much current and can therefore be a relatively small size transistor.

Figure 2B:
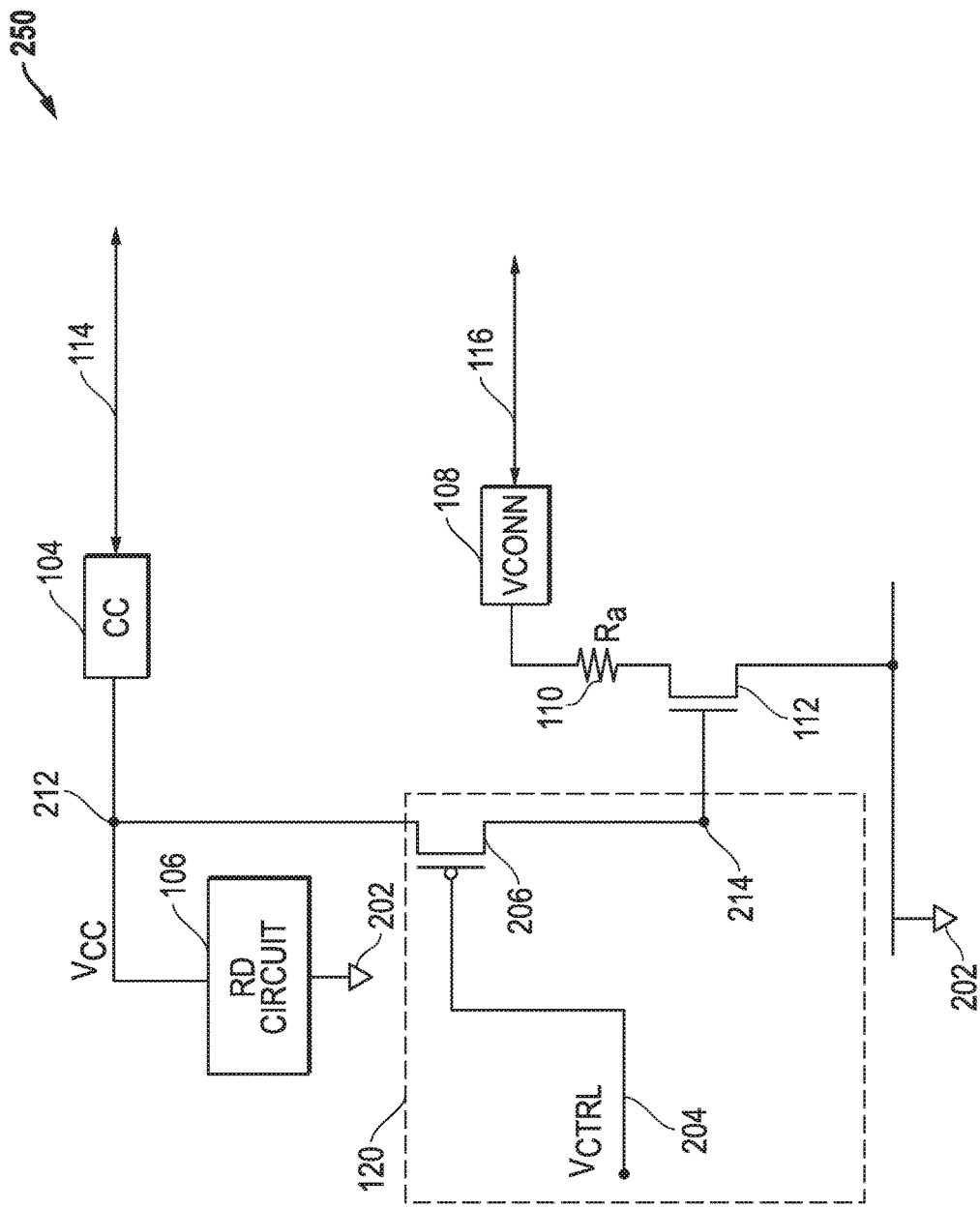

FIG. 2B is a circuit diagram of an example embodiment 250 for the control circuit 120 and the switch 112 where the NMOS transistor 208 in FIG. 2A has been removed. For the embodiment of FIG. 2A, the NMOS transistor 208 helps to keep NMOS transistor 112 turned off when PMOS transistor 206 is off by pulling the gate of NMOS transistor 112 to ground 202. However, NMOS transistor 208 can be removed as shown in embodiment 250 of FIG. 2B, and the control circuit 120 then includes PMOS transistor 206. For this embodiment, the gate of NMOS transistor 112 will be pulled to the voltage (VCC) on the CC pin 104 turning "on" the NMOS transistor 112 when the pull-down control signal ($V_{CTRL}$) 204 is low to turn "on" PMOS transistor 206. The gate of the NMOS transistor 112 will then be disconnected from the voltage (VCC) on the CC pin 104 and left as a floating node when pull-down control signal ($V_{CTRL}$) 204 is high to turn "off" PMOS transistor 206.

Figure 2C:
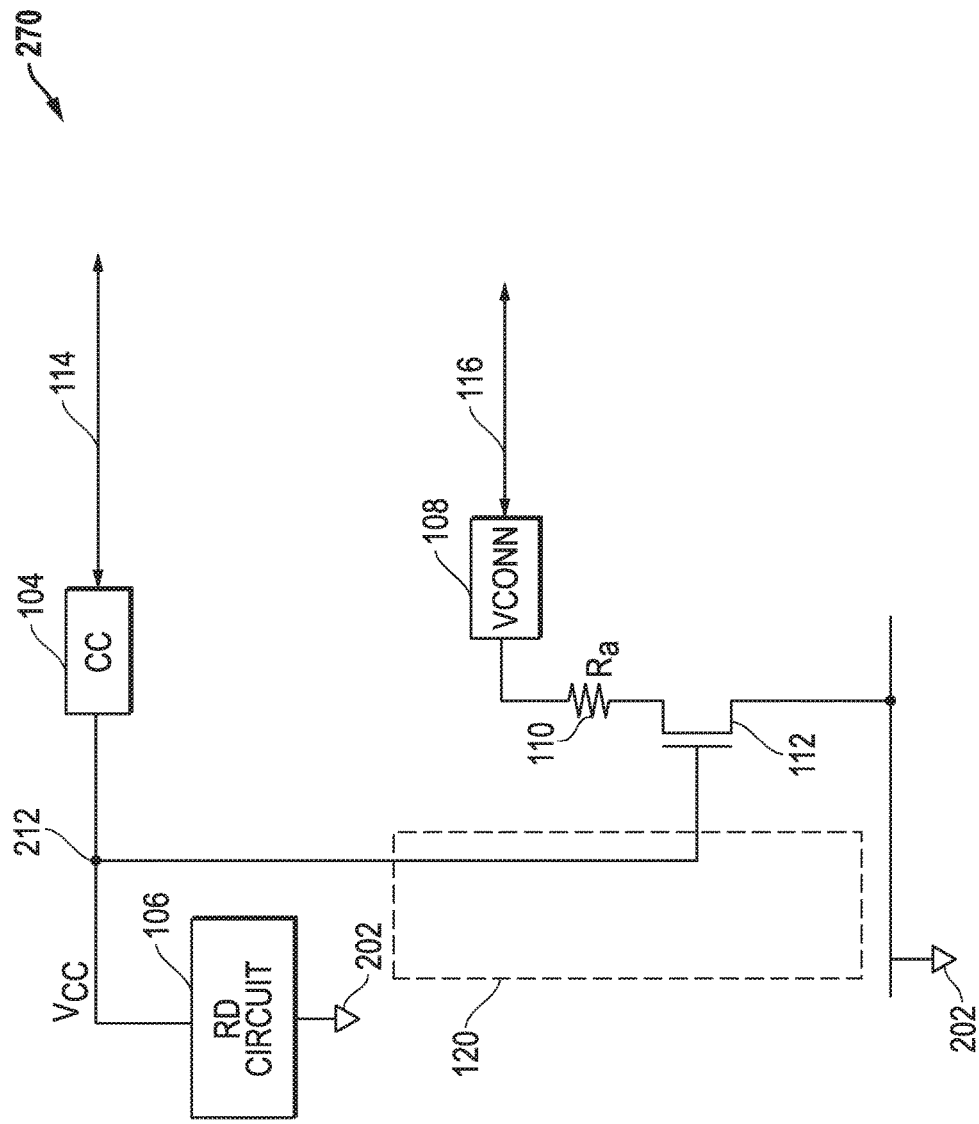

FIG. 2C is a circuit diagram of an example embodiment 270 for the control circuit 120 and the switch 112 where the transistors 206 and 208 in FIG. 2A have been removed. For this embodiment, the control circuit 120 is a direct connection such that node 212 is directly connected to the gate of NMOS transistor 112. The gate of NMOS transistor 112 will therefore follow the voltage (VCC) on the CC pin 104. For example, when the current (Ip) 114 is presented on the CC pin 104, the NMOS transistor 112 will be "on" and closed to pull the VCONN pin 108 to ground. When no current or voltage is presented on the CC pin 104, the NMOS transistor 112 will be "off" and open to isolate the VCONN pin 108 from ground. Because of the direct connection, the switch 112 will be turned on and off based upon the voltage that is present on the CC pin 104 during various modes of operation for the device 102.

It is noted that FIGS. 2A-C provide example embodiments for the control circuit 120 that provides the voltage (VCC) on the CC pin 104 to control the VCONN switch 112. Other variations could also be implemented.

Figure 3A:
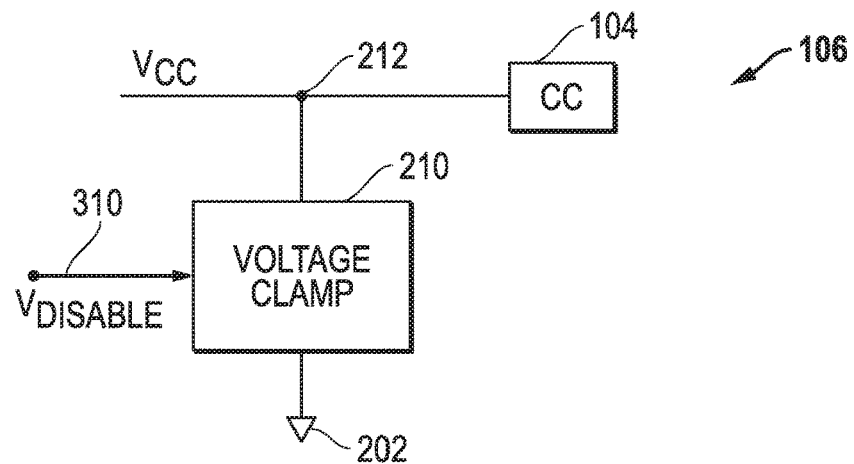
FIGS. 3A-C are diagrams of example embodiments for the RD circuit in FIG. 1 including a voltage clamp and/or a resistance/switch.

FIG. 3A is a diagram of an example embodiment for the RD circuit 106 where a voltage clamp 210 is coupled to the CC pin 104. For this example embodiment, the voltage clamp 210 is coupled between node 212 and ground 202. The voltage clamp 210 operates to clamp the voltage on the CC pin 104 to a desired voltage range. For this embodiment, the voltage clamp 210 can be activated or deactivated by disable signal ($V_{DISABLE}$) 310. If activated by the disable signal ($V_{DISABLE}$) 310, the voltage clamp 210 operates to clamp the voltage on the CC pin 104 to a desired voltage range. This clamped voltage satisfies the USB Type-C specification requirements for presenting a resistance (Rd) or a clamped voltage (vRd) on the CC connection. If deactivated by the disable signal ($V_{DISABLE}$) 310, the voltage clamp 210 does not operate.

Figure 3B:
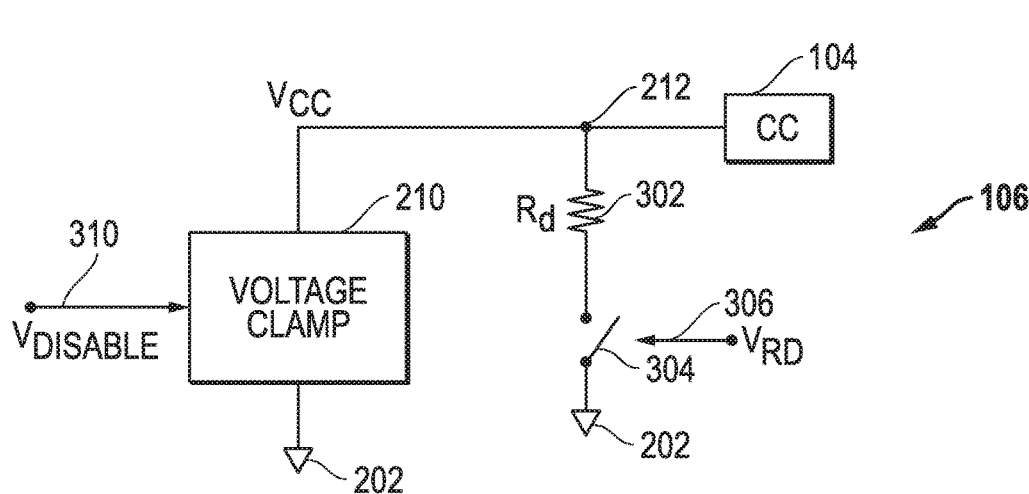

FIG. 3B is a diagram of an example embodiment for the RD circuit 106 where a voltage clamp 210 is coupled to the CC pin 104 along with a resistance (Rd) 302 and a switch 304. For this example embodiment, the voltage clamp 210 is again coupled between node 212 and ground 202. The resistance (Rd) 302 is coupled between node 212 and switch 304, and switch 304 is coupled between resistance (Rd) 302 and ground 202. Switch 304 is controlled by RD control signal ($V_{RD}$) 306, and can be an NMOS transistor. For this embodiment, the voltage clamp 210 is also activated or deactivated by disable signal ($V_{DISABLE}$) 310. If activated by the disable signal ($V_{DISABLE}$) 310, the voltage clamp 210 operates to clamp the voltage on the CC pin 104 to a desired voltage range. This clamped voltage satisfies the USB Type-C specification requirements for presenting a voltage (vRd) on the CC connection. If deactivated by the disable signal ($V_{DISABLE}$) 310, the voltage clamp 210 does not operate. If controlled by RD control signal ($V_{RD}$) 306 to be "on" and closed, the switch 304 pulls the CC pin 104 to ground and presents the resistance (Rd) 302. If controlled by RD control signal ($V_{RD}$) 306 to be "off" and open, the switch 304 disconnects the CC pin 104 from ground.

For certain embodiments, the disable signal ($V_{DISABLE}$) 310 and the RD control signal ($V_{RD}$) 306 can be applied so that only the voltage clamp 210 or the switch 304 is active at any time. For example, the voltage clamp 210 can be activated during dead-battery mode, and the switch 304 can be "off" and open during dead battery mode. In powered mode, the voltage clamp 210 can be deactivated, and the switch 304 can be "on" and closed. Further, the disable signal ($V_{DISABLE}$) 310 and the RD control signal ($V_{RD}$) 306 can both be provided by the pull-down control signal ($V_{CTRL}$) 204 described above. It is further noted that the disable signal ($V_{DISABLE}$) 310 can be provided by a voltage signal or a logic control signal that is one logic voltage level (e.g., high logic level) when it is desired to turn "off" or deactivate the voltage clamp 210 and another logic voltage level (e.g., low logic level) when it is desired to turn "on" or activate the voltage clamp 210. For example, for a UFP device 102 in USB Type-C connection that enables the clamp in dead battery mode and turns it off otherwise to enable the resistance provided by pull-down transistor 302 shown in FIG. 3B, a voltage supply signal for the UFP device 102 can be directly connected to the disable signal ($V_{DISABLE}$) 310. Other variations could also be implemented.

Figure 3C:
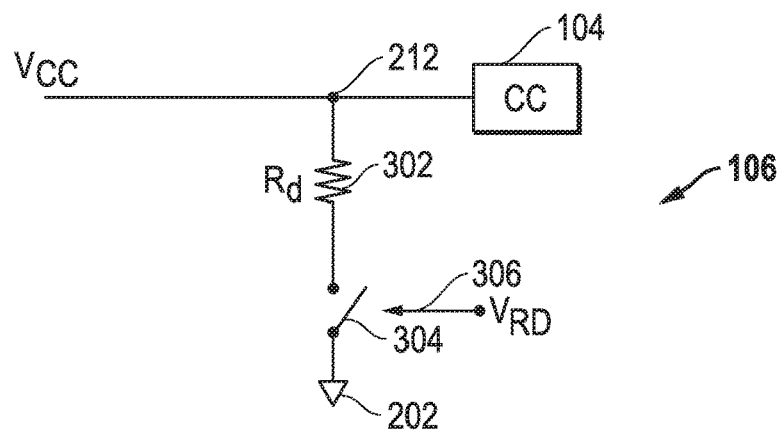

FIG. 3C is a diagram of an example embodiment for the RD circuit 106 where a resistance (Rd) 302 and a switch 304 are used. For this example embodiment, the resistance (Rd) 302 is coupled between node 212 and switch 304, and switch 304 is coupled between resistance (Rd) 302 and ground. Switch 304 is controlled by RD control signal ($V_{RD}$) 306, and can be an NMOS transistor. If controlled by RD control signal ($V_{RD}$) 306 to be "on" and closed, the switch 304 pulls the CC pin 104 to ground and presents the resistance (Rd) 302. If controlled by RD control signal ($V_{RD}$) 306 to be "off" and open, the switch 304 disconnects the CC pin 104 from ground.

It is noted that FIGS. 3A-C provide example embodiments for the RD circuit 106 that presents a resistance (Rd) or a clamped voltage (vRd) as required by the USB Type-C specification. It is also noted that the resistance (Rd) 302 can be implemented using one or more resistors and/or other circuits that provide an impedance between the CC pin 104 and ground. For example, a MOS (metal oxide semiconductor) transistor, such as an NMOS transistor, turned "on" or connected as a resistor can be used to provide the resistance (Rd) 302. As shown in more detail in FIG. 5, it is noted that the resistance (Rd) 302 can be provided by the "on" resistance of the transistor 304. Other variations could also be implemented.

Figure 4A:
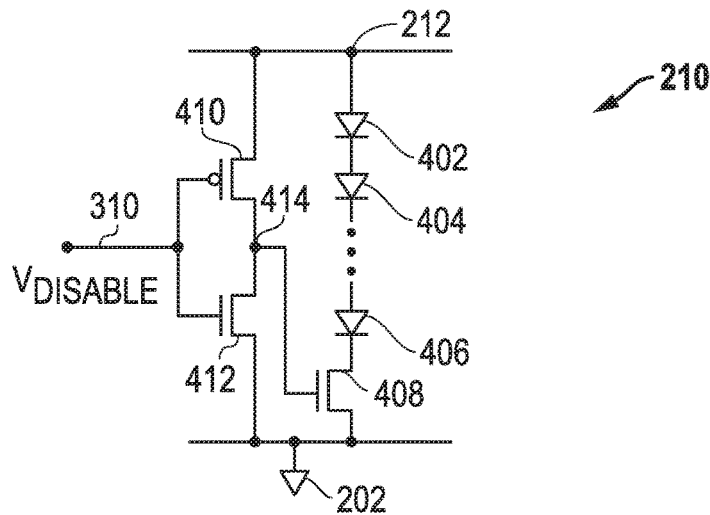
FIGS. 4A-B are circuit diagrams of example embodiments where the voltage clamp is implemented as a diode clamp circuit.

FIG. 4A is a circuit diagram of an example embodiment where the voltage clamp 210 is implemented as a diode clamp circuit. For this embodiment, one or more diodes 402, 404, ... 406 are coupled between node 212 and ground 202 through the drain/source of an NMOS transistor 408. The NMOS transistor 408 has it gate coupled to node 414. A PMOS transistor 410 has its gate coupled to the disable signal ($V_{DISABLE}$) 310 and its source and drain coupled between node 212 and node 414. An NMOS transistor 412 has its gate coupled to the disable signal ($V_{DISABLE}$) 310 and its drain and source coupled between node 414 and ground 202. When NMOS transistor 408 is "on" and closed by the disable signal ($V_{DISABLE}$) 310 being set at a low logic level, the diodes 402, 404, ... 406 clamp the voltage (VCC) on node 212 to a voltage based upon the threshold voltages of the diodes 402, 404, ... 406 and the output resistance of NMOS transistor 408. When NMOS transistor 408 is "off" and opened by the disable signal ($V_{DISABLE}$) 310 being set to a high logic level, the diodes 402, 404, ... 406 are effectively disabled and inactive. It is also noted that transistors 408, 410, and 412 can be removed where no enable/disable control is desired. Further, it is noted that the diodes 402, 404, ... 406 can also be implemented as MOS transistors. Other variations could also be implemented.

Figure 4B:
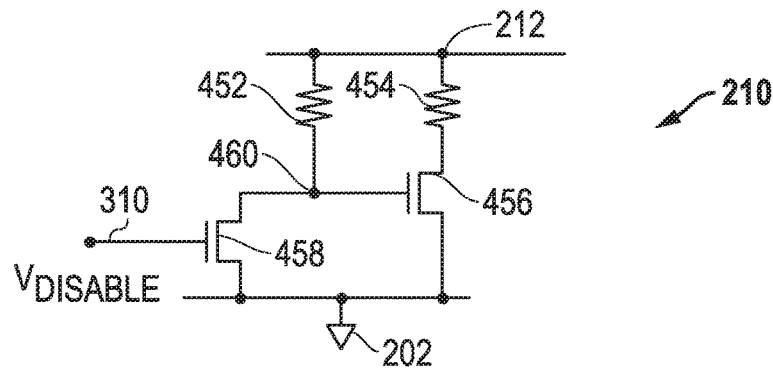

FIG. 4B is a circuit diagram of an example embodiment where the voltage clamp 210 is implemented as a diode clamp circuit. For this embodiment, a resistance 454 is coupled between node 212 and ground 202 through the source/drain of an NMOS transistor 456. The NMOS transistor 456 has it gate coupled to node 460. A very large resistance 452 is coupled between node 212 and node 460. An NMOS transistor 458 has its gate coupled to the disable signal ($V_{DISABLE}$) 310 and its drain and source coupled between node 460 and ground. When NMOS transistor 456 is "on" and closed by the disable signal ($V_{DISABLE}$) 310 being set at a low logic level, the voltage (VCC) on node 212 is clamped to a voltage based upon resistance 454 and the threshold voltage of NMOS transistor 456. When NMOS transistor 456 is "off" and opened by the disable signal ($V_{DISABLE}$) 310 being set to a high logic level, the clamp circuit 210 is effectively disabled and inactive. It is also noted that transistor 458 can be removed where no enable/disable control is desired. Other variations could also be implemented.

Figure 5:
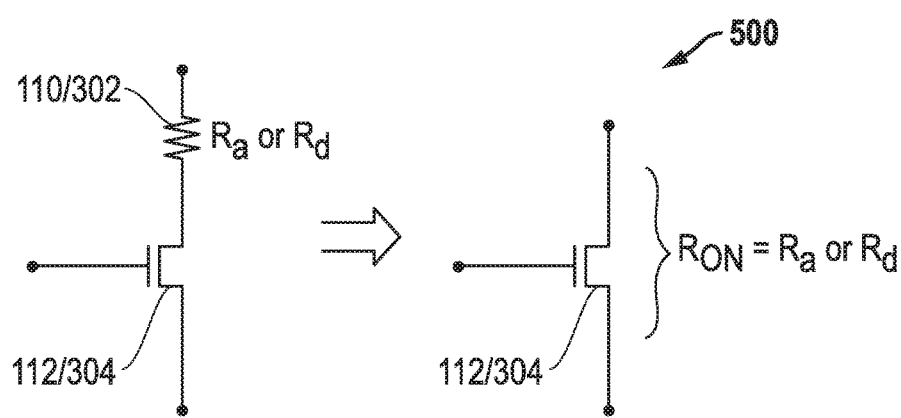
FIG. 5 is a circuit diagram of an example embodiment where a resistance/switch circuit is implemented using the "on" resistance provided by a switch.

FIG. 5 is a circuit diagram of an example embodiment 500 where a switch 112/304 and a resistance (Ra) 110 and/or a resistance (Rd) 302 are implemented using the "on" resistance ($R_{ON}$) provided by the switch 112 and/or the switch 304, respectively. As described above the resistance (Ra) 110 and the resistance (Rd) 302 can be implemented by one or more resistors or other circuits that provide a desired resistance. In addition, as shown in FIG. 5, the resistance (Ra) 110 and/or the resistance (Rd) 302 can be implemented and presented using the "on" resistance of the transistor 112 and/or the transistor 304, respectively. For example, the "on" resistance ($R_{ON}$) for the NMOS transistor 112 can be set to be the resistance (Ra) 110, and the "on" resistance ($R_{ON}$) for the NMOS transistor 304 can be set to be the resistance (Rd) 302. Other variations could also be implemented.

Figure 6:
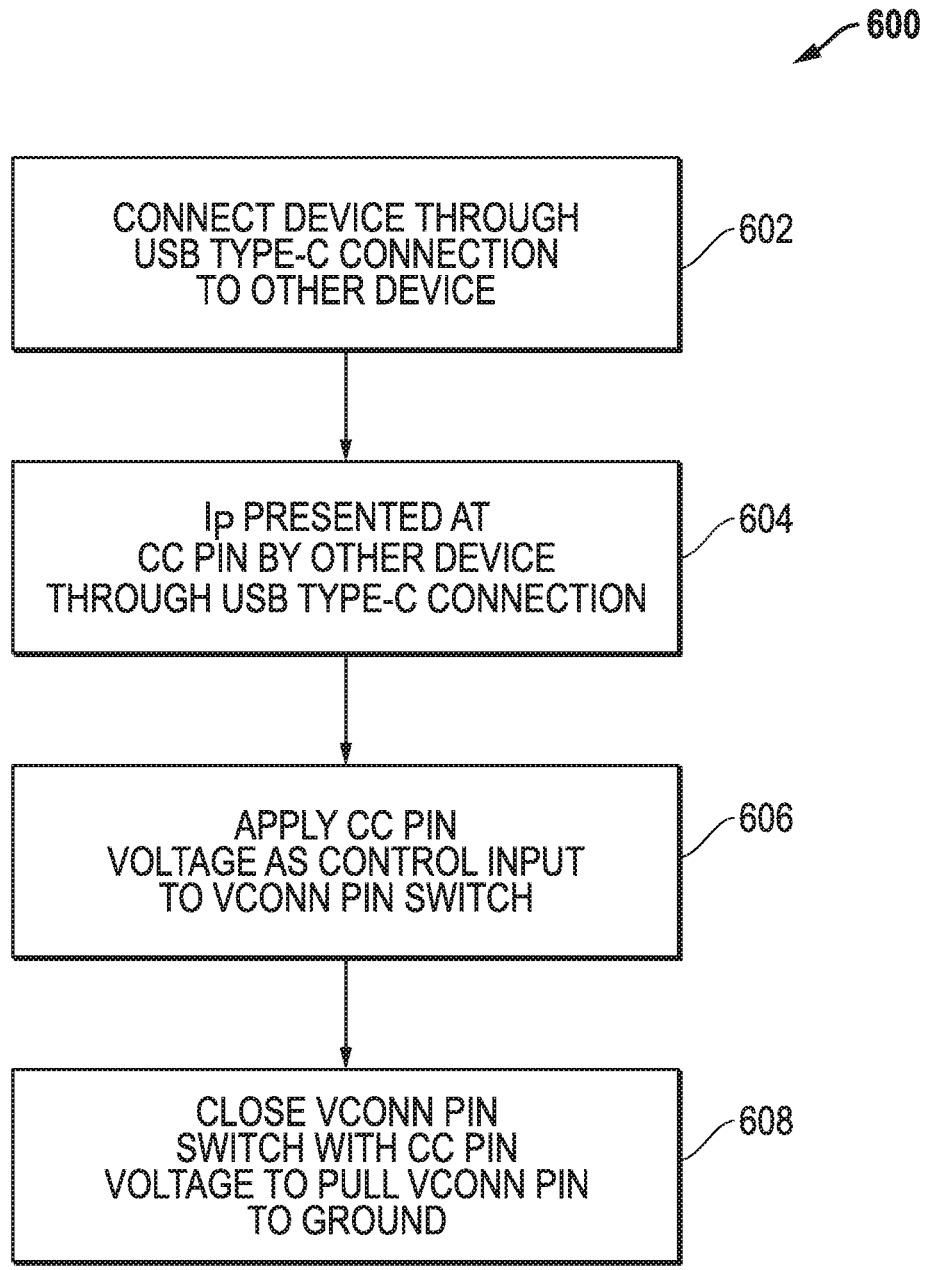
FIG. 6 is a process flow diagram of an example embodiment to control pull-down of the VCONN pin for a UFP device in a USB Type-C connection.

FIG. 6 is a process flow diagram of an example embodiment 600 to control pull-down of the VCONN pin 108 during detached or dead-battery modes for a UFP device 102 in a USB Type-C connection. In block 602, the device 102 is connected to another device 122 through a USB Type-C connection. In block 604, a current (Ip) is presented at the CC pin 104 through the USB Type-C connection. In block 606, the voltage (VCC) on the CC pin 104 is applied as a control input to the switch 112 for the VCONN pin 108. In block 608, the switch 112 is closed using the voltage (VCC) on the CC pin 104 to pull the VCONN pin 108 to ground. Other variations and process flows steps could also be used while still taking advantage of the VCONN pull-down switch control techniques described herein.

Figure 7:
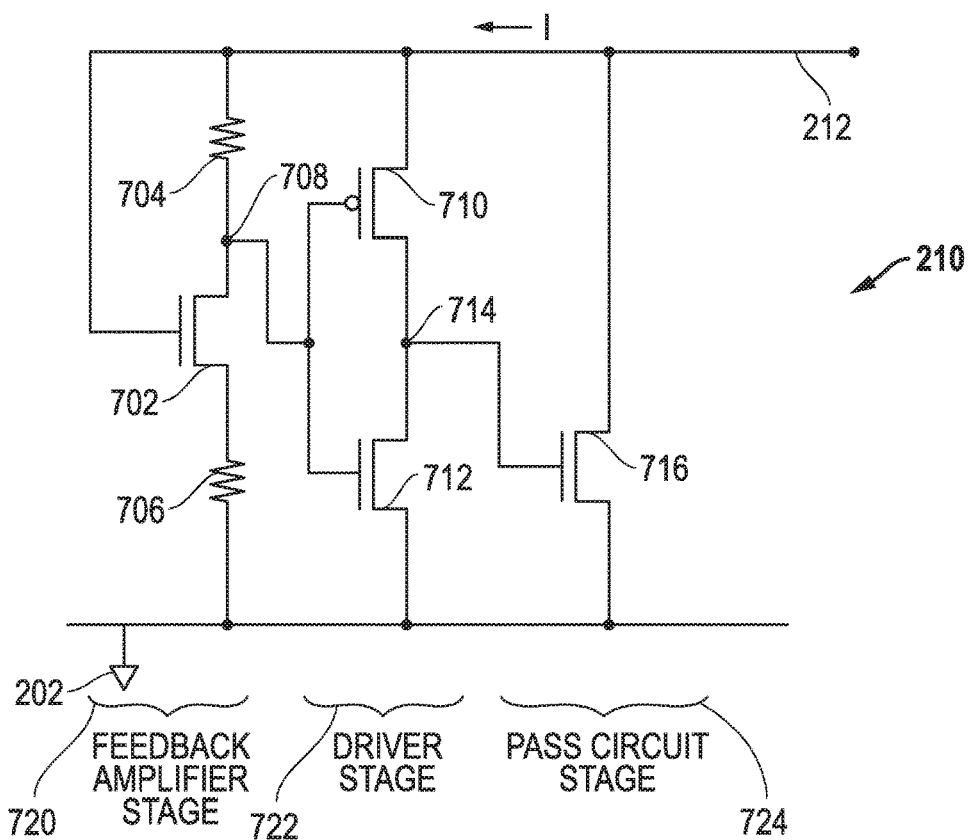
FIG. 7 is a circuit diagram of an example embodiment where the voltage clamp is implemented using a feedback amplifier stage, a driver stage, and a pass circuit stage.

FIG. 7 is a circuit diagram of an example embodiment for voltage clamp 210 implemented using a feedback amplifier stage 720, a driver stage 722, and a pass circuit stage 724. For this example embodiment, the feedback amplifier stage 720 is coupled to a driver stage 722, and the driver stage 722 is coupled to the pass circuit stage 724. For the pass circuit stage 724, NMOS transistor 716 has its gate coupled to node 714 and its drain and source coupled between node 212 and ground 202. For the driver stage 722, PMOS transistor 710 has its gate coupled to node 708 and its source and drain coupled between node 212 and node 714, and NMOS transistor 712 has its gate coupled to node 708 and its drain and source coupled between node 714 and ground 202. For the feedback amplifier stage 720, a resistor 704 is coupled between node 212 and node 708. NMOS transistor 702 has its gate coupled to node 212, has its drain coupled to node 708, and has its source coupled to resistance 706. Resistance 706 is coupled between NMOS transistor 702 and ground 202. It is noted that resistances 704 and 706 are used to set the gain of the feedback amplifier stage 720 (e.g., gain based upon a ratio of resistance 704 to resistance 706), and resistance 706 could be removed if desired. The feedback amplifier stage 720 provides a degenerated common source amplifier; however, other types of feedback stages and amplifiers can also be used to implement feedback amplifier stage 720. It is also noted that resistance 704 and resistance 706 can be implemented as one or more resistors and/or other circuits that provide desired impedance values for resistances 704 and 706. Other variations could also be implemented.

In operation, the voltage clamp 210 of FIG. 7 operates to control and clamp the voltage (VCC) on node 212 as a closed loop circuit without an external reference voltage connection and without a supply voltage connection. In part, the voltage clamp 210 of FIG. 7 includes inherent reference voltage generation that is based on the threshold voltage of the feedback amplifier stage 720 and the driver stage 722. Resistances 704/706 and NMOS transistor 702 operate as a feedback amplifier for the feedback amplifier stage 720. PMOS transistor 710 and NMOS transistor 712 operate as a driver for the driver stage 722. And NMOS transistor 716 operates as a pass transistor for the pass circuit stage 724. Node 714, which is connected to the gate of NMOS transistor 716, is kept low when the voltage on node 212 is lower than a desired target voltage which can be the threshold voltage of transistor 702 (e.g., 0.6 to 0.8 volts), turning off the pass device 716. When the VCC voltage on node 212 starts to exceed this target voltage due to the increase in the amount of current (I) passing through node 212 (e.g., injected current (Ip) for a USB Type-C connection), node 714 becomes biased so that NMOS transistor 716 is gradually turned on to clamp the output voltage on node 212 to a desired voltage (e.g., between 0.88 volts and 1.32 volts). This output voltage clamping occurs because the gradual turning on of the pass device 716 with respect to the increase in the injected current (I) causes it to leak the extra increased current to ground. As such, the total voltage (e.g., product of impedance and injected current (I)) will effectively remain at the same or near the same value as when the pass device 716 started to turn on. This desired clamp voltage will be maintained for all injected current values until NMOS transistor 716 is fully turned on, after which the NMOS transistor 716 essentially operates as a diode clamp.

When the voltage on node 212 is small, NMOS transistor 702 will be off, and node 708 will follow the voltage on node 212 through resistance 704. The transistors 710/712 will essentially operate as an inverter with a high input thereby pulling node 714 to ground and turning off NMOS transistor 716. When the voltage on node 212 becomes larger than the threshold voltage of NMOS transistor 702, NMOS transistor 702 turns on and drives a current through resistance 704. This current causes the voltage difference between node 212 and node 708 to rise. Once this voltage difference is greater than the threshold voltage of the driver 722, the driver 722 turns on and transistors 710/712 operate as a driver with high gain to drive node 714 to a high voltage. As the voltage on node 714 rises, the NMOS transistor 716 will turn on to a point where the loop becomes stable and the voltage on node 212 becomes fixed, as can be seen below in FIG. 8 at about 1.3 volts. If the current (I) continues to increase, the voltage difference between node 212 and node 708 will also continue to increase thereby causing an increase to the voltage on node 714 until NMOS device 716 can no longer be turned on any stronger at which point the voltage at node 714 is very close to the voltage at node 212. At this point, the loop saturates and the NMOS device 716 essentially operates as a diode clamp.

Figure 11:
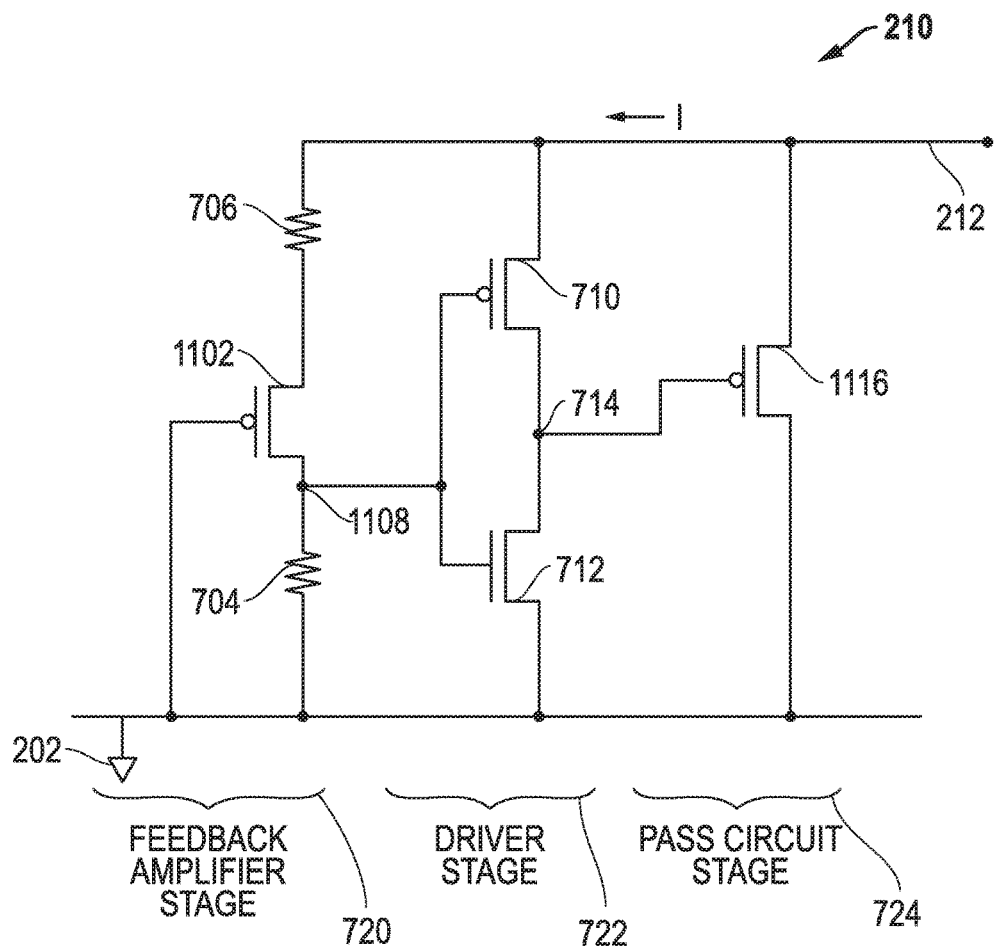
FIG. 11 is a circuit diagram of an example embodiment for the voltage clamp of FIG. 7 implemented using PMOS transistors for the feedback amplifier stage and the pass circuit stage.

It is noted that the NMOS transistor 716 could also be implemented as a PMOS transistor to provide the pass transistor for the voltage clamp 210, for example, as shown in FIG. 11 below. It is further noted that the ratio of resistance 704 (R704) to resistance 706 (R706) can be ten (i.e., R704/R706=10), although other ratios could also be used. It is also noted that additional gain stages could be included between the feedback amplifier stage 720 and the pass transistor stage 724. Further, the feedback amplifier stage 720 could be implemented using a PMOS feedback transistor, for example, as shown in FIG. 11 below. Other variations could also be provided.

Figure 8:
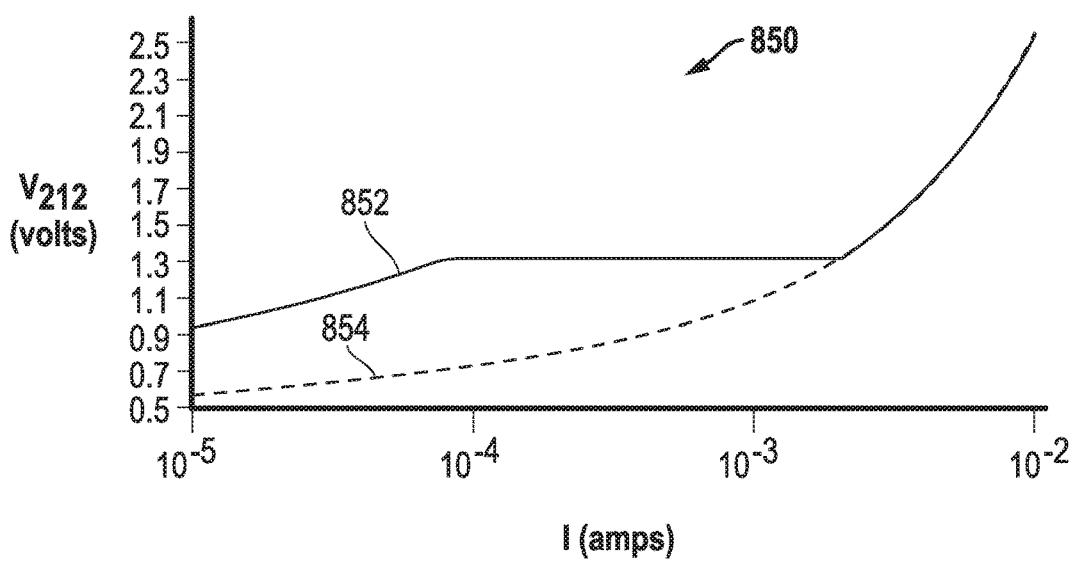
FIG. 8 is a diagram of an example embodiment showing a comparison of the clamped voltage for the example embodiment of FIG. 7 and FIGS. 4A-B as the input current increases.

FIG. 8 is a diagram of an example embodiment 850 for the clamped voltage ($V_{212}$) on node 212 for the example embodiment of FIG. 7 as the input current (I) presented on node 212 increases. The x-axis represents the current (I), such as an injection current (Ip) for a USB Type-C connection, from about 10 micro-Amps to about 10 milli-Amps. The y-axis represents the voltage ($V_{212}$) on node 212 from about 0.5 volts to about 2.5 volts. Solid line 852 represents the voltage ($V_{212}$) on node 212 that is clamped by the voltage clamp 210 shown in FIG. 7. The dashed line 854 represents the voltage that would be provided if a diode clamp circuit, such as those shown in FIGS. 4A-B, were coupled between node 212 and ground 202 rather than the circuitry shown in FIG. 7 for the voltage clamp. It is also noted that the voltage clamp circuit in FIG. 7 provides a flat fixed voltage (e.g., about 1.3 volts) over a current range as shown in FIG. 8. As such, for this current range, the clamped voltage value is relatively independent of the injected current, and this current range is configured to be the desired operable current range for the device using the voltage clamp circuit of FIG. 7. In contrast, the diode clamp circuits of FIGS. 4A-B will have a clamped voltage value that depends on the injected current over this operational range. As indicated above, the loop saturates as the current (I) continues to increase, and the NMOS device 716 essentially operates as a diode clamp as seen in FIG. 8 at the right side of embodiment 850 where line 852 and dashed line 854 meet and follow each other.

The voltage clamp 210 of FIG. 7 therefore operates to clamp the voltage on node 212 for a range of currents (I) applied to node 212, such as injection currents (Ip) presented at the CC pin 104 for a USB Type-C connection. In addition, the voltage clamp 210 also compensates for temperature variations. The equation below represents the voltage difference ($\Delta V$) between node 212 and node 708:

$$\Delta V = R_{Top} \times \left[ \frac{K_{M2}}{2} (V_{gsM2} - V_{thM2})^2 \right]$$

For this equation, $R_{Top}$ is resistance 704; $K_{M2}$ is the gain provided by NMOS transistor 702; $V_{gsM2}$ is the gate-to-source voltage for NMOS transistor 702, and $V_{thM2}$ is the threshold voltage for NMOS transistor 702. It is noted that the clamp will start to operate when $\Delta V$ is equal to the threshold voltage of the driver stage 722 which will typically happen when the current increases a little more from the point where the current makes the voltage at node 212 becomes higher than the threshold voltage ($V_{thM2}$) for NMOS transistor 702. It is also noted that the loop inherently provides an internal voltage reference as a local reference that is equal to $V_{thM2}$ plus the threshold voltage of the driver stage 722. As described below, this internal reference is generally compensated against temperature and process variations, as well.

From the equation above, it is seen that $\Delta V$ increases with an increase of $R_{Top}$, and decreases with an increase of $V_{THM2}$. Resistance 704 and the threshold voltage of NMOS transistor 702 can be implemented to have the similar temperature coefficient. As such, their temperature variations will tend to cancel, or partially compensates for, each other thereby removing or highly reducing temperature based deviations in the clamped voltage. It is also noted that the driver threshold voltage will usually not change significantly with temperature as both NMOS transistor 712 and PMOS transistor 710 will likely have comparable temperature deviations in their respective threshold voltages.

Further, deviations due to process variations are also limited by the embodiment in FIG. 7 for the voltage clamp 210. For example, if NMOS transistors are in a slow processing corner (e.g., threshold voltages become higher for NMOS transistors 702/712/716), the voltage required to turn on the first amplifier stage 720 would be higher due to the change in threshold voltage for NMOS transistor 702. However, at the same time, ΔV required to turn on the second driver stage 722 would be lower as NMOS transistor 712 would turn off faster.

It is seen, therefore, that the embodiment in FIG. 7 for voltage clamp 210 provides an advantageous solution for a voltage clamp for node 212 and the CC connection 104 as it helps to reduce or eliminate operational changes due to process variations. This voltage clamp embodiment of FIG. 7 is also useful for other environments were a well-controlled voltage clamp is desired.

It is further noted that the voltage clamp 210 can also be used as a CMOS-only voltage bias circuit and/or CMOS-only bandgap reference circuit. For this bias and/or bandgap embodiment a pull-up circuit, such as resistance or a current source, can be coupled between circuit node 212 and a supply voltage node for an electronic device or integrated circuit including the voltage clamp 210. For such bias and/or bandgap embodiments, the voltage clamp 210 effectively operates to generate a stable bias voltage or stable reference voltage using the circuit node 212. Further, these bias and/or bandgap embodiments can also be used to replace reverse-biased zener diode circuits and can also be used as a load relaxing circuit for regulators. Other variations and uses can also be implemented while still taking advantage of the voltage clamp embodiments described herein.

Figure 9:
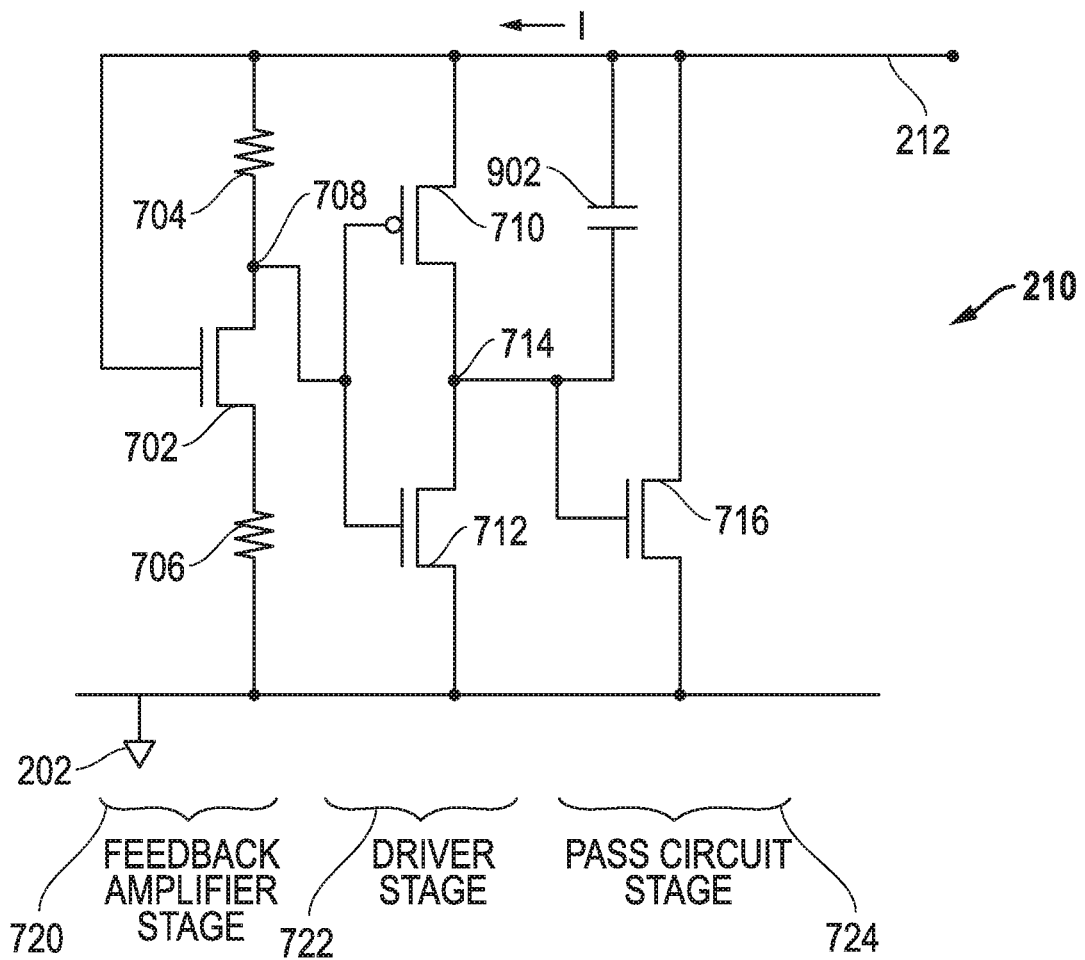
FIG. 9 is a circuit diagram of an example embodiment for the voltage clamp of FIG. 7 where an additional capacitance is included to improve closed-loop stability.

FIG. 9 is a circuit diagram of an example embodiment for the voltage clamp of FIG. 7 where an additional capacitance 902 is coupled between node 714 and node 212 to improve performance. In particular, the capacitance 902 can be included to improve closed loop stability. For example, this capacitance 902 can be used to effectively turn the closed loop provided by the clamp circuitry to be a one dominant pole system thereby providing a more stable control loop. It is noted that capacitance 902 can be implemented as one or more capacitors. Other techniques and variations could also be applied, if desired, to further improve the stability of the system.

Figure 10:
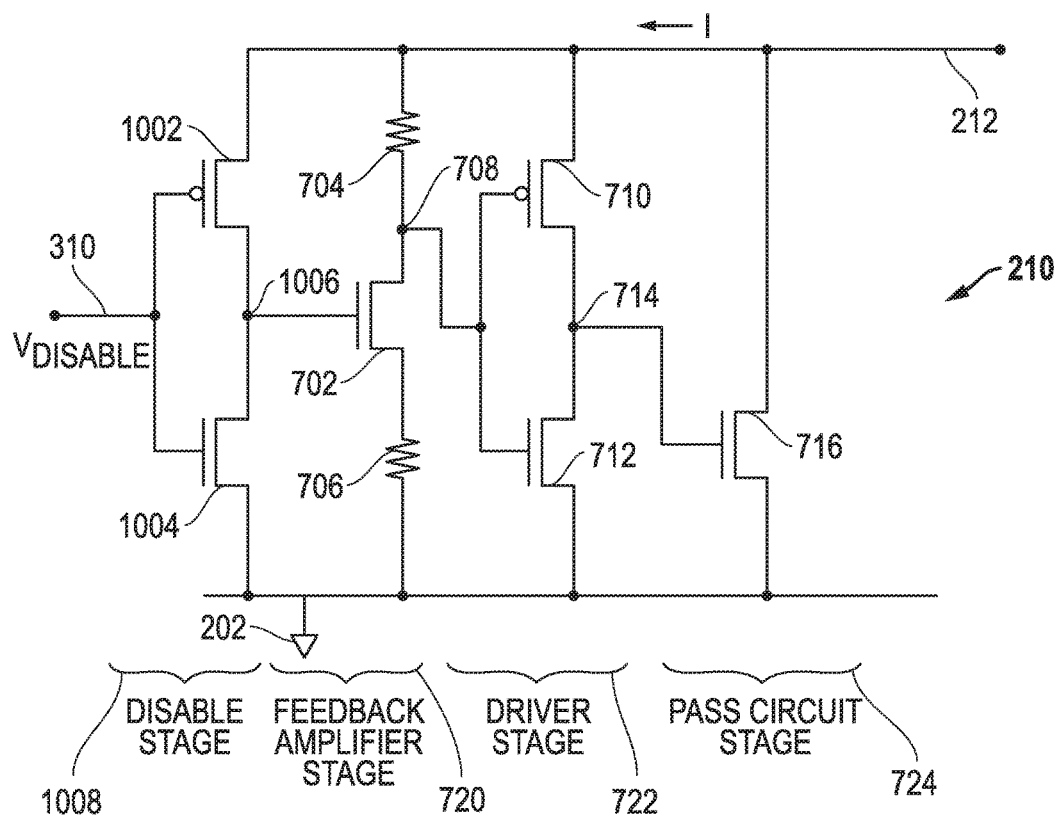
FIG. 10 is a circuit diagram of an example embodiment for the voltage clamp of FIG. 7 where a disable stage has been included to allow for the voltage clamp to be enabled and disabled.

FIG. 10 is a circuit diagram of an example embodiment for the voltage clamp of FIG. 7 where a disable stage 1008 has been included to allow for the voltage clamp to be enabled and disabled. For this example embodiment, the disable stage 1008 includes a PMOS transistor 1002 and an NMOS transistor 1004 controlled by the disable signal (V$_{DISABLE}$) 310. The PMOS transistor 1002 has its gate coupled to the disable signal (V$_{DISABLE}$) 310 and its source and drain coupled between node 212 and node 1006. The NMOS transistor 1004 has its gate coupled to the disable signal (V$_{DISABLE}$) 310 and its drain and source coupled between node 1006 and ground 202. Node 1006 is coupled to the gate of NMOS transistor 702 in the feedback amplifier stage 720. For this embodiment, the disable signal (V$_{DISABLE}$) 310 is active at a high voltage level. As such, when the disable signal (V$_{DISABLE}$) 310 is a low voltage level, NMOS transistor 1004 is off, and PMOS transistor 1002 is on and couples node 1006 to node 212 to activate the voltage clamp 210. When the disable signal (V$_{DISABLE}$) 310 is a high voltage level, PMOS transistor 1002 is off, and NMOS transistor 1004 is on and couples node 1006 to ground 202 to deactivate the voltage clamp 210. As described above, the disable signal (V$_{DISABLE}$) 310 can be provided by a voltage signal or a logic control signal that is one logic voltage level (e.g., high logic level) when it is desired to turn "off" or deactivate the voltage clamp 210 and another logic voltage level (e.g., low logic level) when it is desired to turn "on" or activate the voltage clamp 210. For example, for a UFP device 102 in USB Type-C connection that enables the clamp in dead battery mode and turns it off otherwise to enable the resistance provided by pull-down transistor 302 shown in FIG. 3B, a voltage supply signal for the UFP device 102 can be directly connected to the disable signal (V$_{DISABLE}$) 310. Other variations could also be implemented.

FIG. 11 is a circuit diagram of an example embodiment for voltage clamp 210 implemented using PMOS transistors for the feedback amplifier stage 720 and the pass circuit stage 724. For this example embodiment, the feedback amplifier stage 720 is still coupled to a driver stage 722, and the driver stage 722 is still coupled to the pass circuit stage 724. For the pass circuit stage 724, PMOS transistor 1116 has its gate coupled to node 714 and its source and drain coupled between node 212 and ground 202. For the driver stage 722, PMOS transistor 710 has its gate coupled to node 1108 and its source and drain coupled between node 212 and node 714, and NMOS transistor 712 has its gate coupled to node 1108 and its drain and source couple between node 714 and ground 202. For the feedback amplifier stage 720, a resistance 704 is coupled between ground 202 and node 1108. PMOS transistor 1102 has its gate coupled to ground 202, has its drain coupled to node 1108, and has its source coupled to resistance 706. Resistance 706 is coupled between PMOS transistor 1102 and node 212. It is noted that resistances 704 and 706 are used to set the gain of the feedback amplifier stage 720 (e.g., gain based upon a ratio of resistance 704 to resistance 706), and resistance 706 could be removed if desired. The feedback amplifier stage 720 provides a degenerated common source amplifier; however, other types of feedback stages and amplifiers can also be used to implement feedback amplifier stage 720. It is also noted that resistance 704 and resistance 706 can be implemented as one or more resistors and/or other circuits that provide desired impedance values for resistances 704 and 706. Other variations could also be implemented.

It is further noted that the functional blocks, devices, and/or circuitry described herein can be implemented using hardware, software, or a combination of hardware and software. In addition, one or more processors (e.g., central processing units (CPUs), controllers, microcontrollers, microprocessors, hardware accelerators, programmable integrated circuitry, FPGAs (field programmable gate arrays), ASICs (application specific integrated circuits), and/or other programmable processing circuitry) can be programmed to perform the operations, tasks, functions, or actions described herein for the disclosed embodiments. For example, the one or more electronic circuits can be configured to execute or otherwise be programmed with software, firmware, logic, and/or other program instructions stored in one or more non-transitory tangible computer-readable mediums (e.g., data storage devices, flash memory, random access memory, read only memory, programmable memory devices, reprogrammable storage devices, hard drives, floppy disks, DVDs, CD-ROMs, and/or any other tangible data storage medium) to perform the operations, tasks, functions, or actions described herein for the disclosed embodiments.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for VCONN connection pull-down in a USB Type-C device, comprising:
connecting a device through a USB Type-C connection to a separate device using a plurality of connections including a CC (configuration channel) pin and a VCONN (connection power) pin;
clamping a voltage applied to the CC pin using a voltage clamp coupled between the CC pin and ground; and
applying the clamped voltage on the CC pin to a control node of a VCONN pull-down switch, which is coupled between the VCONN pin and ground, to close the VCONN pull-down switch and pull the VCONN pin to ground through a resistance (Ra).

2. The method of claim 1, further comprising providing the clamped voltage on the CC pin to a control node of the VCONN pull-down switch through a second switch.

3. The method of claim 2, further comprising controlling the second switch with a pull-down control signal to be closed when the device is operating in an unattached mode or a dead-battery mode and to be open when the device is operating in an attached mode or a powered mode.

4. The method of claim 3, wherein the pull-down control signal comprises at least one of a power supply voltage, a power-on-reset (POR) signal, a voltage on the VCONN pin, or a logical control signal.

5. The method of claim 3, wherein the VCONN pull-down switch comprises an NMOS transistor having its drain and source coupled between the VCONN pin and ground and having its gate coupled as the control node for the VCONN pull-down switch.

6. The method of claim 5, wherein the NMOS transistor is configured to provide the resistance (Ra) when turned on to pull the VCONN pin to ground.

7. The method of claim 5, wherein the second switch is a PMOS transistor having its gate coupled to the pull-down control signal and having its source and drain coupled between the CC pin and the control node for the VCONN pull-down switch.

8. The method of claim 7, further comprising coupling the gate of the NMOS transistor to ground through a third switch when the device is operating in the attached mode or the powered mode.

9. The method of claim 8, wherein the third switch is an NMOS transistor having its gate coupled to the pull-down control signal and having its drain and source coupled between the control node for the VCONN pull-down switch and ground.

10. The method of claim 1, further comprising providing the clamped voltage on the CC pin to the control node of the VCONN pull-down switch through a direct connection.

11. The method of claim 1, wherein the voltage clamp comprises at least one of a diode clamp circuit or a closed loop voltage clamp.

12. The method of claim 1, further comprising activating the voltage clamp when the device is operating in an unattached mode or a dead-battery mode and deactivating the voltage clamp when the device is operating in an attached mode or a powered mode.

13. A circuit for connection pull-down in a USB Type-C device, comprising:
a CC (configuration channel) pin for a USB Type-C connection;
a voltage clamp coupled between the CC pin and ground for clamping a voltage applied to the CC pin;
a VCONN (connection power) pin for a USB Type-C connection;
a VCONN pull-down switch coupled to ground and to the VCONN pin; and
a control circuit coupled to the CC pin and to the VCONN pull-down switch, the control circuit being configured to apply the clamped voltage on the CC pin to a control node for the VCONN pull-down switch to close the VCONN pull-down switch and pull the VCONN pin to ground through a resistance (Ra).

14. The circuit of claim 13, wherein a second switch is coupled between the CC pin and the control node for the VCONN pull-down switch.

15. The circuit of claim 14, wherein the second switch has a control node coupled to a pull-down control signal, the pull-down control signal being configured to close the second switch when the device is operating in an unattached mode or a dead-battery mode and to open the second switch when the device is operating in an attached mode or a powered mode.

16. The circuit of claim 15, wherein the pull-down control signal comprises at least one of a power supply voltage, a power-on-reset (POR) signal, a voltage on the VCONN pin, or a logic control signal.

17. The circuit of claim 15, wherein the VCONN pull-down switch comprises an NMOS transistor having its drain and source coupled between the VCONN pin and ground and having its gate coupled as the control node for the VCONN pull-down switch.

18. The circuit of claim 17, wherein the NMOS transistor is configured to provide the resistance (Ra) when turned on to pull the VCONN pin to ground.

19. The circuit of claim 17, wherein the second switch is a PMOS transistor having its gate coupled to the pull-down control signal and having its source and drain coupled between the CC pin and the control node for the VCONN pull-down switch.

20. The circuit of claim 19, further comprising a third switch coupled between the control node for the VCONN pull-down switch and ground, the third switch being configured to couple the gate of the NMOS transistor to ground when the device is operating in the attached mode or the powered mode.

21. The circuit of claim 20, wherein the third switch is an NMOS transistor having its gate coupled to the pull-down control signal and having its drain and source coupled between the control node for the VCONN pull-down switch and ground.

22. The circuit of claim 13, wherein the CC pin is directly connected to the control node of the VCONN pull-down switch.

23. The circuit of claim 13, wherein the voltage clamp comprises at least one of a diode clamp circuit or a closed loop voltage clamp.

24. The circuit of claim 13, wherein the voltage clamp is coupled to receive a disable signal, the disable signal being configured to enable the voltage clamp when the device is operating in an unattached mode or a dead-battery mode and to disable the voltage clamp when the device is operating in an attached mode or a powered mode.

* * * * *